US008275548B2

(12) United States Patent
Marshall et al.

(10) Patent No.: US 8,275,548 B2
(45) Date of Patent: Sep. 25, 2012

(54) METHOD AND APPARATUS FOR DETECTING LIGHTNING ACTIVITY

(75) Inventors: Robert S. Marshall, Ijamsville, MD (US); Christopher Dale Sloop, Mount Airy, MD (US); Ralph Joseph Markson, Weston, MA (US); Stan Heckman, Chelmsford, MA (US); Benjamin E. Beroukhim, Rockville, MD (US); Chonglin Liu, Rockville, MD (US)

(73) Assignee: Earth Networks, Inc., Germantown, MD (US)

( * ) Notice: Subject to any disclaimer, the term of this patent is extended or adjusted under 35 U.S.C. 154(b) by 465 days.

(21) Appl. No.: 12/542,404

(22) Filed: Aug. 17, 2009

(65) Prior Publication Data

US 2011/0040483 A1 Feb. 17, 2011

(51) Int. Cl.
*G01W 1/00* (2006.01)
*G06F 19/00* (2011.01)
*G06F 17/40* (2006.01)

(52) U.S. Cl. ........... 702/4; 73/170.25; 324/72; 340/601; 340/659; 340/870.09; 340/870.16; 702/187; 702/189

(58) Field of Classification Search ............... 73/170.16, 73/170.24, 432.1, 865.8; 324/72, 72.5; 340/500, 340/540, 601, 657, 659, 870.01, 870.07, 340/870.09, 870.16; 702/1, 2, 3, 4, 57, 60, 702/64, 66, 127, 187, 188, 189, 190, 191, 702/193; 708/100, 105, 131, 160, 200, 300, 708/303
See application file for complete search history.

(56) References Cited

U.S. PATENT DOCUMENTS

| 2,864,081 | A | * | 12/1958 | Steelman | 342/460 |
| 3,121,296 | A | * | 2/1964 | Ekstrom | 451/124 |
| 3,772,594 | A | * | 11/1973 | Kuehnast | 324/72 |
| 4,543,580 | A | | 9/1985 | Bent et al. | 343/460 |
| 4,792,806 | A | | 12/1988 | Bent et al. | 342/465 |
| 4,801,942 | A | | 1/1989 | Markson et al. | 342/460 |
| 4,812,852 | A | | 3/1989 | Bent et al. | 342/457 |

(Continued)

FOREIGN PATENT DOCUMENTS

WO    WO 97/05508 A2 *  2/1997

OTHER PUBLICATIONS

International Search Report and Written Opinion dated Oct. 5, 2010 from PCT/US2010/45759, 11 pages.

(Continued)

*Primary Examiner* — Edward Cosimano
(74) *Attorney, Agent, or Firm* — Proskauer Rose LLP (57) ABSTRACT

Described are methods and apparatuses, including computer program products, for detecting lightning activity. Waveform data indicative of lightning activity is received by a waveform sensor from one or more signal converters. The waveform data comprises a group of electromagnetic waveforms. The waveform data is filtered by a processor to remove noise frequencies. One or more uncompressed portions of the waveform data are transmitted to a processing server. Digital filter data based on the one or more uncompressed portions of waveform data are received from the processing server. One or more frequencies are removed from the waveform data based on the digital filter data. The waveform data is compressed. The compressing includes selecting one or more points on a waveform, wherein the one or more points are above a predetermined threshold. The compressing includes determining an inflection of the selected points based on a predefined algorithm.

27 Claims, 8 Drawing Sheets

U.S. PATENT DOCUMENTS

| | | | |
|---|---|---|---|
| 4,901,564 A | 2/1990 | Williams et al. | 73/170 R |
| 4,914,444 A * | 4/1990 | Pifer et al. | 342/460 |
| 4,916,455 A | 4/1990 | Bent et al. | 342/457 |
| 4,972,195 A | 11/1990 | Markson et al. | 342/457 |
| 4,996,473 A | 2/1991 | Markson et al. | 324/72 |
| 5,036,334 A * | 7/1991 | Henderson et al. | 342/460 |
| 5,057,820 A | 10/1991 | Markson et al. | 340/600 |
| 5,153,508 A | 10/1992 | Blakeslee et al. | 324/72 |
| 5,295,071 A * | 3/1994 | Kuzma et al. | 702/4 |
| 5,295,072 A * | 3/1994 | Stevens et al. | 702/4 |
| 5,299,127 A * | 3/1994 | Stevens et al. | 702/4 |
| 5,303,152 A * | 4/1994 | Moses et al. | 702/4 |
| 5,305,210 A * | 4/1994 | Kuzma et al. | 702/4 |
| 5,319,553 A * | 6/1994 | Gregg et al. | 702/4 |
| 5,325,299 A * | 6/1994 | Moses et al. | 702/4 |
| 5,396,220 A | 3/1995 | Markson et al. | 340/600 |
| 5,537,318 A * | 7/1996 | Moses et al. | 702/4 |
| 5,699,245 A * | 12/1997 | Herold | 702/4 |
| 5,771,020 A | 6/1998 | Markson et al. | 342/460 |
| 6,064,340 A * | 5/2000 | Croft et al. | 342/460 |
| 6,246,367 B1 | 6/2001 | Markson et al. | 342/460 |
| 6,298,118 B1 | 10/2001 | Liggett | 379/21 |
| 6,420,862 B2 * | 7/2002 | Medelius et al. | 324/72 |
| 6,552,521 B1 * | 4/2003 | Medelius et al. | 324/72 |
| 6,599,242 B1 | 7/2003 | Splett et al. | 600/300 |
| 6,768,946 B2 * | 7/2004 | Okabe et al. | 702/4 |
| 6,788,043 B2 * | 9/2004 | Murphy et al. | 324/72 |
| 6,791,311 B2 | 9/2004 | Murphy et al. | 324/72 |
| 6,791,482 B2 | 9/2004 | Koyanagi | 341/61 |
| 6,868,339 B2 * | 3/2005 | Murphy et al. | 702/4 |
| 7,266,345 B2 | 9/2007 | Park | 455/57.13 |
| 7,460,956 B2 * | 12/2008 | Murphy et al. | 702/4 |
| 7,672,783 B2 * | 3/2010 | Oettinger | 702/4 |
| 7,970,542 B2 * | 6/2011 | Bent et al. | 702/4 |
| 8,073,622 B2 * | 12/2011 | Said et al. | 702/4 |
| 2001/0048297 A1 * | 12/2001 | Medelius et al. | 324/72 |
| 2003/0107490 A1 | 6/2003 | Sznaider et al. | 340/601 |
| 2003/0151397 A1 * | 8/2003 | Murphy et al. | 324/72 |
| 2003/0151398 A1 * | 8/2003 | Murphy et al. | 324/72 |
| 2003/0187580 A1 * | 10/2003 | Okabe et al. | 702/4 |
| 2004/0204854 A1 | 10/2004 | Murphy et al. | 702/4 |
| 2005/0197070 A1 | 9/2005 | Kaikuranta et al. | 455/67.13 |
| 2005/0251711 A1 * | 11/2005 | Murphy et al. | 714/700 |
| 2007/0156339 A1 * | 7/2007 | Oettinger | 702/4 |
| 2007/0260151 A1 | 11/2007 | Clifford | 600/509 |
| 2008/0085096 A1 | 4/2008 | Marshall | 386/52 |
| 2008/0262732 A1 | 10/2008 | Davis et al. | 702/4 |
| 2009/0281730 A1 * | 11/2009 | Said et al. | 702/4 |
| 2009/0295587 A1 * | 12/2009 | Gorman, Jr. | 340/601 |

OTHER PUBLICATIONS

Schmidt, K., et al., "A Comparative Analysis of Lightning Data During the EU-Brazil TROCCINOX/TroCCiBras Campaign", VIII International Symposium on Lightning Protection, Nov. 21-25, 2005, 6 pages.

Betz, H.D., et al., "LINET—An international lightning detection network in Europe", Atmos. Res., 2008, 10 pages.

Betz, H.D., et al., "Cell-tracking with lightning data from LINET", Adv. Geosci., 17, 55-61, 2008, 7 pages.

* cited by examiner

| Message Type 402 | Sensor ID 404 | Timestamp (s) 406 | Timestamp Differential (ns) 408 | Message Length 410 |

*Message Header*  FIG. 4A

| Initial Tick Number 422 | Initial Amplitude 424 | # of Inflections 426 | Inflection 432a | Inflection 432b | Pulse Section Two |

Pulse Header 420 — Pulse Body 430

Pulse Section One 415

*Message Body*  FIG. 4B

METHOD AND APPARATUS FOR DETECTING LIGHTNING ACTIVITY

FIELD OF THE INVENTION

The subject matter of this application relates generally to methods and apparatuses, including computer program products, for detecting lightning activity.

BACKGROUND OF THE INVENTION

Lightning includes electrical discharges within a cloud, intracloud (IC) discharges, and cloud to ground (CG) discharges. Lightning occurs when electrical fields within a cloud intensify as particles of opposite polarity collect at differing regions within the cloud. Lightning begins with a an initial electrical breakdown (pulse) followed by leader channels from which a series of channel branches grow within a cloud forming a comprehensive branch channel structure. For IC lightning, the channel structure remains within the cloud. A CG discharge occurs when one or more branches extend from a cloud to the ground.

Accurate and efficient detection of early lightning activity, particularly the weaker, initial IC discharges, is critical for advanced forecasting of severe weather phenomena such as tornadoes, damaging downburst winds, and potentially deadly cloud-to-ground lightning strikes. Integrated detection of both IC lightning and CG lightning can provide highly advanced predictive capabilities for characterizing severe storm precursors, improving lead times and comprehensive weather management planning. Numerous lightning detection systems and methods have been developed, each striving to determine the location, frequency and intensity of lightning activity with better accuracy. Examples of such systems include the U.S. Precision Lightning Network (USPLN) and the National Lightning Detection Network (NLDN).

The primary challenge existing with lightning detection is two-fold: detecting lightning activity at the earliest possible moment, and detecting the broadest possible range of lightning activity over a large area. Some systems detect only a portion of the electromagnetic frequencies associated with lightning activity, resulting in incomplete lightning strike data. Some systems conduct intensive and time-consuming processing of raw lightning data, which might delay the generation of lightning strike data and hinder the advanced notification of essential news and safety personnel. In addition, some systems consist of expensive components which limits the maximum potential distribution of said systems, leaving a gap in lightning detection coverage in certain areas.

SUMMARY OF THE INVENTION

It would be desirous to develop a system and method that provides integrated detection and processing of both IC and CG lightning activity over an expansive area of coverage. The system and method of the claimed invention possess the ability to capture a large amount of electromagnetic waveform data from the atmosphere, while efficiently filtering and analyzing the waveform data for indications of lightning activity. The claimed invention also provides for dissemination and availability of the lightning activity data, allowing earlier warnings to be issued and preventive measures to be taken.

In one aspect, there is a method for detecting lightning activity. Waveform data indicative of lightning activity is received by a waveform sensor from one or more signal converters. The waveform data comprises a group of electromagnetic waveforms. The waveform data is filtered by a processor to remove noise frequencies. One or more uncompressed portions of the waveform data are transmitted to a processing server. Digital filter data based on the one or more uncompressed portions of waveform data are received from the processing server. One or more frequencies are removed from the waveform data based on the digital filter data. The waveform data is compressed. The compressing includes selecting one or more points on a waveform, wherein the one or more points are above a predetermined threshold. The compressing includes determining an inflection of the selected points based on a predefined algorithm.

In another aspect, there is a method for detecting lightning activity. Waveform data indicative of lightning activity is received by a processing server from one or more waveform sensors. The waveform data includes compressed and uncompressed portions. Digital filter data is generated at the processing server based on one or more uncompressed portions of the waveform data from a selected sensor. The digital filter data is transmitted to the selected sensor. The compressed waveform data from each of the one or more sensors is converted by the processing server into a time sample. The compressed waveform data from the one or more sensors is aligned by the processing server based on a time of arrival of the compressed waveform data. The aligning includes determining a location and height of a waveform based on the compressed waveform data, determining an offset of the waveform based on the time sample associated with the compressed waveform data, and determining a peak current of the waveform based on the compressed waveform data. Lightning strike data is generated based on the conversion and alignment of the compressed waveform data.

In another aspect, there is a system for detecting lightning activity. The system includes one or more waveform sensors. The waveform sensors are configured to receive waveform data from one or more signal converters. The waveform data comprises a group of electromagnetic waveforms. The sensor comprises a processor that filters the waveform data to remove noise frequencies and compress the waveform data. The compressing includes selecting one or more points above a predetermined threshold on a waveform, and determining an inflection of the selected points based on a predefined algorithm. The system includes a processing server configured to receive waveform data from the one or more waveform sensors, wherein the waveform data comprises compressed and uncompressed waveform data. The processing server is configured to generate digital filter data based on one or more uncompressed portions of waveform data from a particular sensor and transmit the digital filter data to the selected sensor. The processing server is configured to convert the compressed waveform data from each of the one or more sensors into a time sample, and align the compressed waveform data from the one or more sensors based on a time of arrival of the compressed waveform data. The aligning comprises determining a location and height of a waveform based on the compressed waveform data, determining an offset of the waveform based on the time sample associated with the compressed waveform data, and determining a peak current of the waveform based on the compressed waveform data. The processing server is configured to generate lightning strike data based on the conversion and alignment of the compressed waveform data.

In another aspect, there is a system for detecting lightning activity. The system includes means for receiving waveform data from one or more signal converters. The waveform data comprises a group of electromagnetic waveforms. The system includes means for filtering the waveform data to remove noise frequencies and means for compressing the waveform data. The compressing includes selecting one or more points above a predetermined threshold on a waveform, and determining an inflection of the selected points based on a predefined algorithm. The system includes means for receiving waveform data from the one or more waveform sensors, wherein the waveform data comprises compressed and uncompressed waveform data. The system includes means for generating digital filter data based on one or more uncompressed portions of waveform data from a particular sensor and transmitting the digital filter data to the selected sensor. The system includes means for converting the compressed waveform data from each of the one or more sensors into a time sample, and means for aligning the compressed waveform data from the one or more sensors based on a time of arrival of the compressed waveform data. The aligning comprises determining a location and height of a waveform based on the compressed waveform data, determining an offset of the waveform based on the time sample associated with the compressed waveform data, and determining a peak current of the waveform based on the compressed waveform data. The system includes means for generating lightning strike data based on the conversion and alignment of the compressed waveform data.

In some examples, any of the aspects can include one or more of the following features. The compressing can occur substantially simultaneously with the filtering of the waveform data. The compressed waveform data can be transmitted to a processing server. The compressed waveform data can be transmitted to the processing server every second. The transmission of the compressed waveform data can be coordinated with a timing global positioning device connected to the waveform sensor.

In other examples, the waveform data is collected by a radio frequency antenna connected to the waveform sensor via the one or more signal converters. The one or more converters can comprise a high-frequency converter and a low-frequency converter. The high-frequency converter can be capable of processing frequencies between 5 kHz and 12 MHz. The low-frequency converter can be capable of processing frequencies between 1 Hz and 250 kHz.

In some examples, the selecting step further comprises selecting about one thousand points on each waveform. The compressed waveform data can be stored in a temporary storage device connected to the waveform sensor. Weather conditions data can be received at the waveform sensor from a weather device. The weather conditions data can be transmitted to a processing server.

In other examples, a confidence level can be generated based on the location of the one or more sensors. The confidence level can be assigned to the lightning strike data. A graphical representation of the lightning strike data can be generated. The graphical representation can comprise a geographical map corresponding to the coverage area of the sensors.

In some examples, an alert associated with the lightning strike data can be generated. The alert can be transmitted to a remote device. The lightning strike data can be stored in a storage device. The lightning strike data can be transmitted to a remote device. The lightning strike data can be provided to a requesting device.

In other examples, the processing server can receive the waveform data from each of the one or more sensors at the same time. The step of aligning the waveform data can include data received from at least four sensors. The step of generating the lightning strike data can comprise determining a type of lightning strike based on the waveform frequency. The type of lightning strike can include intracloud lightning and cloud-to-ground lightning.

In some examples, the one or more sensors can be configured to transmit one or more uncompressed portions of the waveform data to the processing server. The sensors can be configured to receive digital filter data based on the one or more uncompressed portions of waveform data from the processing server. The sensors can be configured to remove one or more frequencies from the waveform data based on the digital filter data.

Further features and advantages of the present invention as well as the structure and operation of various embodiments of the present invention are described in detail below with reference to the accompanying drawings.

DETAILED DESCRIPTION

In general overview, the techniques described below includes methods and apparatuses that are for detecting lightning activity. The techniques are related to rapidly and efficiently processing waveform data from multiple geographically-dispersed sensors in order to determine the location of intracloud and cloud-to-ground lightning strikes. One important advantage of using these techniques is the determination of the precise location of lightning activity. The ability to efficiently and quickly determine where lightning activity is occurring leads to greater advance warning of potentially dangerous conditions. Another advantage of these techniques is the generation of an accurate digital filter by continually monitoring atmospheric noise frequency levels and updating the digital filter in each sensor based on the monitoring. A more accurate filter provides substantially increased detection of electromagnetic activity specific to lightning strikes, which in turn leads to a more comprehensive awareness of areas of current and impending lightning activity.

Figure 1:
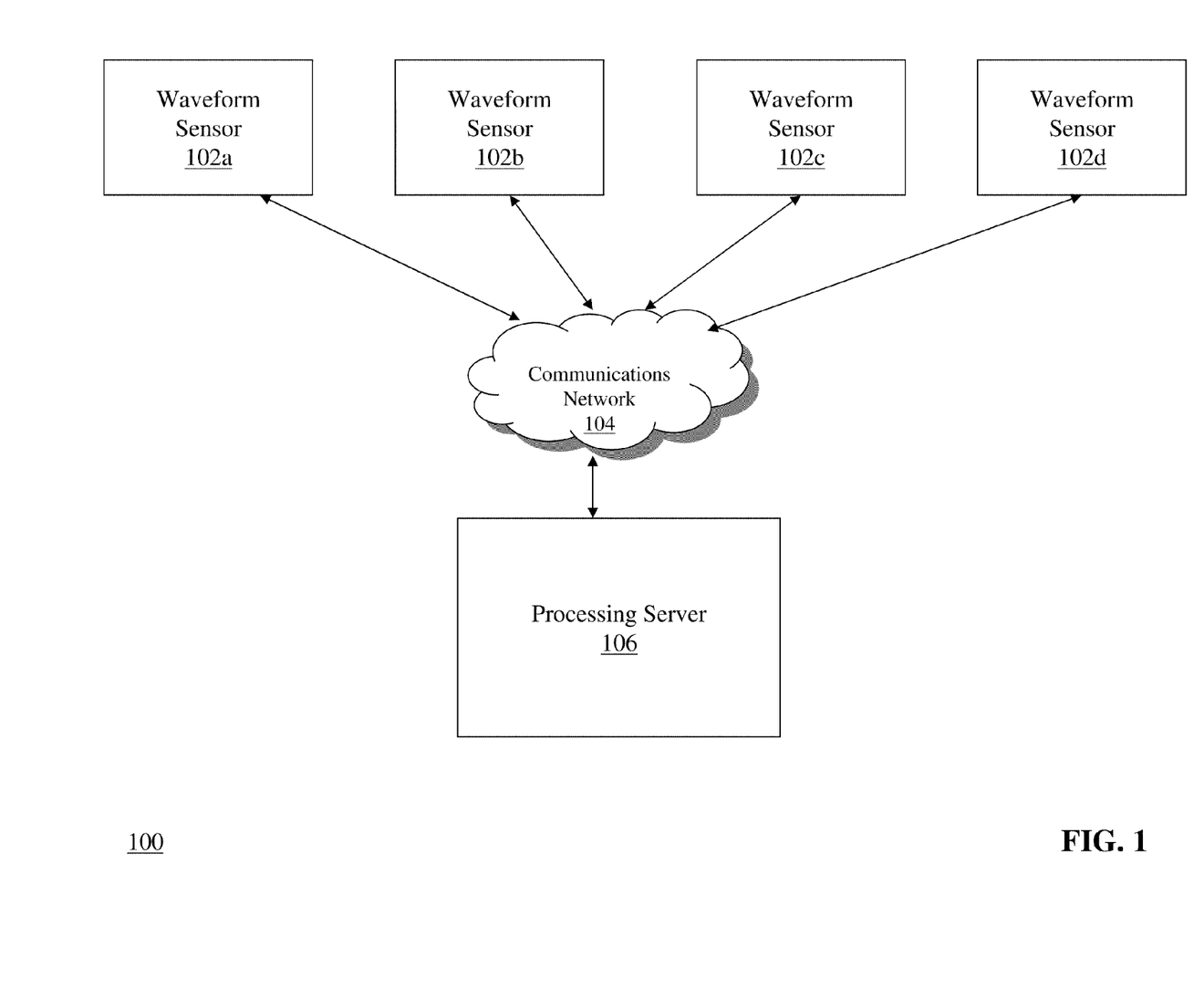
FIG. 1 is a block diagram of an exemplary system for detecting lightning activity.

FIG. 1 is a block diagram of an exemplary system 100 for detecting lightning activity. The system 100 includes waveform sensors 102a-102d, a communications network 104, and a server computing device 106. While the preferred embodiment as shown in FIG. 1 includes four waveform sensors 102a-102d, the system 100 can include any number of waveform sensors. The waveform sensors 102a-102d can be dispersed to multiple geographic locations. The sensors 102a-102d and the processing server 106 can communicate via a communications network, e.g., communications network 104.

Figure 2:
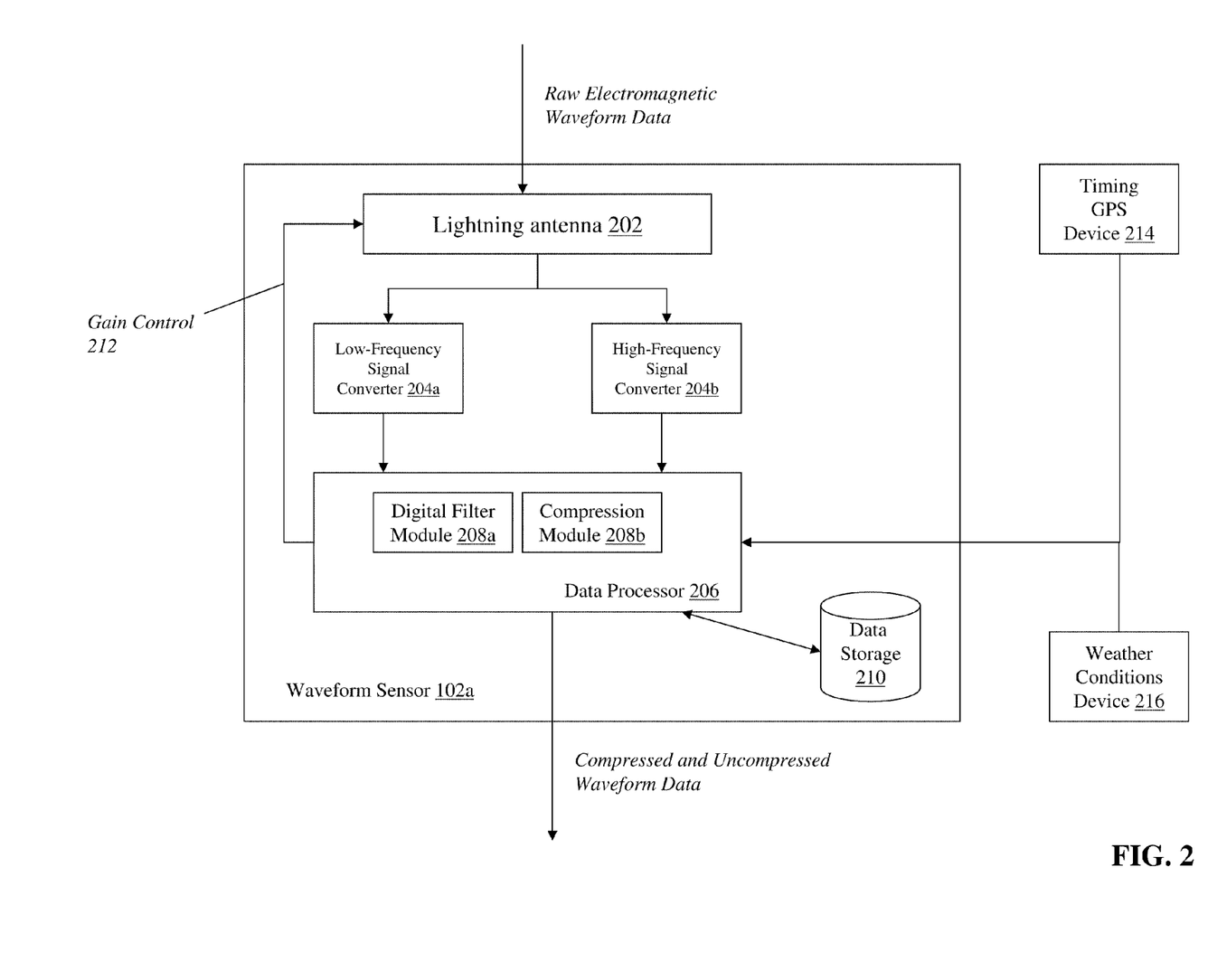
FIG. 2 is a detailed block diagram of an exemplary waveform sensor for receiving, filtering and compressing electromagnetic waveform data.

The waveform sensors 102a-102d are the devices that filter and compress electromagnetic waveform data collected from the atmosphere in order to detect lightning activity. FIG. 2 is a detailed block diagram of an exemplary waveform sensor (e.g., sensor 102a) for use in the system 100. The waveform sensor 102a includes an antenna 202, a low-frequency signal converter 204a, a high-frequency signal converter 204b, a data processor 206 which includes a digital filter module 208a and a data compression module 208b, a data storage module 210, and a gain control link 212 between the data processor 206 and the antenna 202. The sensor 102a is connected to a timing GPS module 214 and a weather conditions module 216.

The sensor 102a uses the lightning antenna 202 to detect electromagnetic waveform data from the atmosphere around the sensor. The antenna 202 is configured to detect analog radio frequency (RF) energy (e.g., pulses) from a lightning discharge. A detected pulse generally has a duration of about a microsecond or less with a rise time of about one hundred nanoseconds and a fall time somewhat longer. In some examples, the antenna 202 can comprise an E-field antenna and a crossed loop antenna. The E-field antenna provides the amplitude of the detected pulse, and the crossed loop antenna provides a direction for the initial lightning pulse. In other examples, the antenna 202 can be a single broadband radio frequency antenna.

The antenna 202 transmits the collected electromagnetic waveform data to the low-frequency digital converter 204a and high-frequency digital converter 204b. Each converter comprises an integrated circuit which samples the analog waveform signals from the antenna 202 and converts the signals into a digital format for processing by the data processor 206, such as digital signal processors manufactured by Analog Devices, Inc. of Norwood, Mass. In one example, the converters 204a-204b sample the waveform data from the antenna continuously at a sampling rate of approximately 24 million samples per second. The low-frequency digital converter 204a and the high-frequency digital converter 204b each sample waveform data from the antenna at different resolutions and frequencies. In one embodiment, the low-frequency digital converter 204a samples waveform data at 24 bits of resolution, and at frequencies less than or equal to 1.8 MHz, while the high-frequency digital converter 204b samples waveform data at 14 bits of resolution, and at frequencies greater than 1.8 MHz and less than or equal to 24 MHz. Since the amplitude of a detected pulse is known to fall off as a function of distance, one advantage of utilizing two converters 204a-204b which sample at different frequencies is that low-frequency detection can be used to determine the location of lightning flashes that occur at longer distances from the sensor 102a. The different ranges of frequency detection can also be used to classify lightning activity as either intracloud or cloud-to-ground activity because, generally speaking, intracloud lightning occurs at higher frequencies than cloud-to-ground lightning. In addition, by enabling separate processing of high and low frequency data, the sensor 102a can provide more efficient data collection, allowing the system 100 to process the data more quickly and enable earlier detection of lightning activity.

The converters 204a-204b can write the sampled waveform data to a temporary storage module (not shown), such as a buffer, so that the data processor 206 can read the buffered data for filtering and compression. Alternatively, the converters 204a-204b can transmit the sampled data to the data processor 206 'on-the-fly', that is, without first writing the data to a temporary storage buffer.

Figure 3:
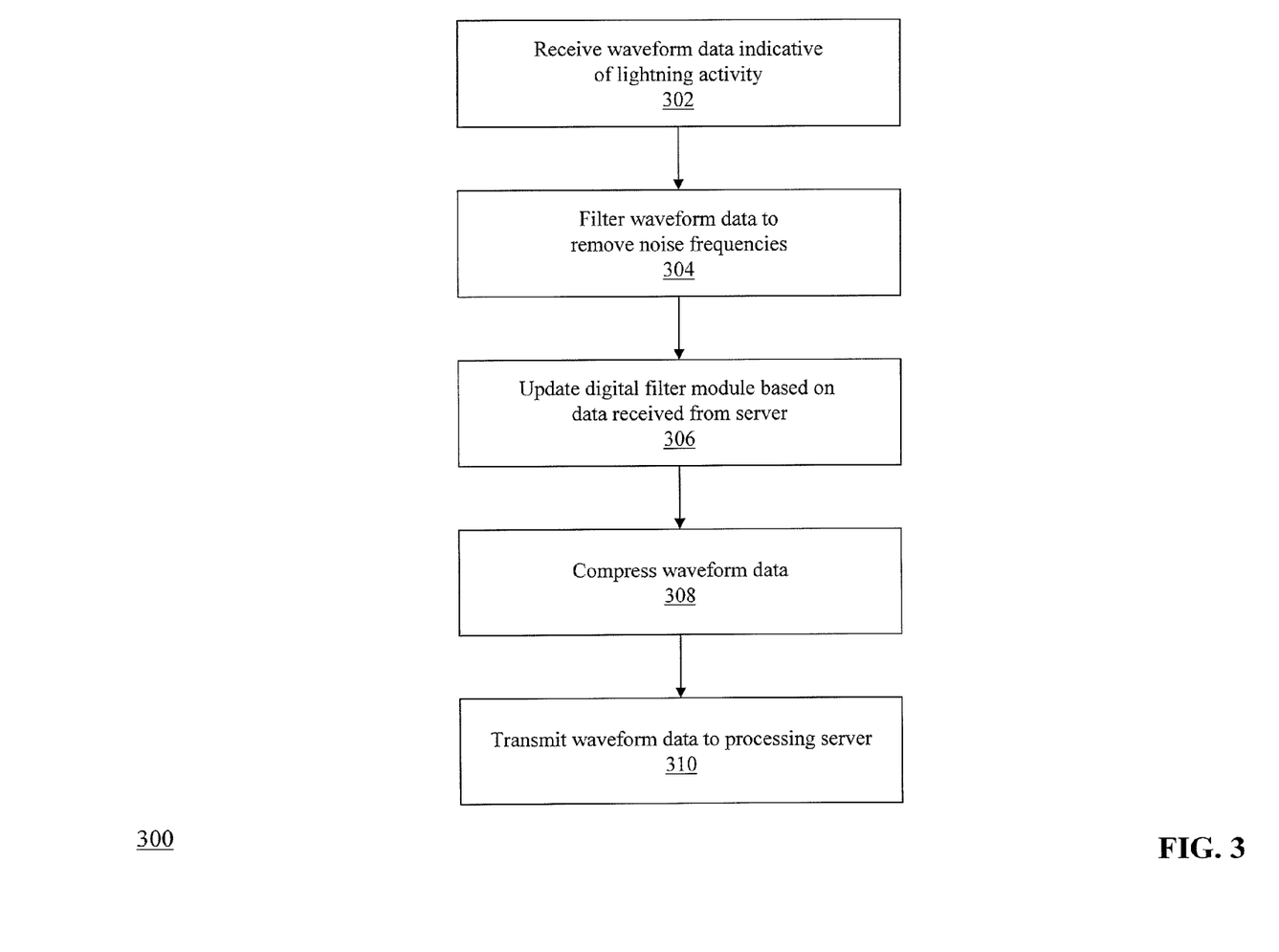
FIG. 3 is a flow diagram of an exemplary method for receiving, filtering and compressing electromagnetic waveform data.

FIG. 3 is a flow diagram of an exemplary method for receiving, filtering and compressing electromagnetic waveform data. Once the converters 204a-204b have sampled waveform data, the data processor 206 receives (302) each sample of waveform data for processing. An example data processor 206 is the Blackfin® digital signal processor chip manufactured by Analog Devices, Inc. The data processor 206 filters (304) the data to remove noise frequencies. As part of the filtering process, the data processor 206 receives digital filter data from the processing server 106 and updates (306) the digital filter module 208a based on the filter data. The data processor 206 compresses (308) the data for transmission to the processing server 106. The data processor 206 also generates a tick number for each sample and correlates the tick sample with timing data received from the timing GPS device 214 in order to assign a time of arrival (i.e., time that the sample arrived at the sensor 102a) to each sample. The data processor 206 generates the tick number by incrementing, for example, a 32-bit counter each time a sample is received. The data processor 206 transmits (310) the filtered, compressed waveform data to the processing server 106 for further processing.

The timing GPS device 214 is synchronized with a satellite positioning signal and provides a single timing 'pulse', accurate to around 100 nanoseconds, to the data processor 206 every UTC second. An example timing GPS device 214 is the Motorola M12+ Timing Receiver manufactured by Motorola Inc. of Schaumberg, Ill. The data processor 206 correlates the pulse received from the timing GPS 214 with the tick numbers assigned to the waveform samples. For example, if the data processor 206 receives a pulse from the timing GPS 214 in between two tick numbers, the data processor 206 will determine a precise time of arrival for the samples associated with those tick numbers.

The data processor 206 utilizes a digital filter module 208a to examine the samples of waveform data and isolate segments of waveform with amplitudes that exceed a predefined high threshold or fall below a predefined low threshold in order to remove background noise frequencies. Generally, the atmosphere contains a certain amount of "background" electromagnetic energy produced from various natural or man-made sources which is not attributable to lightning activity and is therefore irrelevant to determining the location of a lightning strike. The waveform data collected by the sensor 102a includes data related to the background energy, which can affect the accuracy of the system 100. The digital filter module 208a evaluates each sample of waveform data generated by the digital converters 204a-204b, and decides whether to keep the sample for further processing because the sample is above or below a predefined threshold or discard the sample as mere background noise.

If the digital filter module 208a determines that a sample either exceeds or falls below a predefined threshold, the digital filter module 208a sends the sample to the data compression module 208b. The compression module 208b prepares the waveform sample for transmittal to the processing server 106 by compressing the data associated with the waveform sample. The compression module 208b marks points along the waveform sample that exceed or fall below the predefined thresholds. In one embodiment, the compression module 208b marks about one thousand points. The compression module 208b determines the inflection between each marked point (e.g., the change in amplitude) and the overall amplitude range (e.g., the initial and ending values) for the marked points, and stores the data in a temporary storage module (e.g., data storage 210). The compression module 208b discards the unmarked points.

In some examples, the filtering by the digital filter module 208a and the compression by the compression module 208b can occur in substantially real time. In other examples, the filtering by the digital filter module 208a and the compression by the compression module 208b can occur at substantially the same time.

The waveform sensor 102a also includes a gain control communication link 212 between the data processor 206 and the antenna 202. The gain control link 212 allows the data processor 206 to control the level of amplification applied to the electromagnetic waveform signals when collected by the antenna 202. For example, during intense thunderstorms, the antenna 202 can get saturated with electromagnetic energy, driving the amplitude of the waveform beyond a readable level. In another example, the antenna 202 may not be amplifying the collected waveforms to a sufficient degree to produce useable waveform data. In either case, the digital filter module 208a cannot accurately process the waveform data and lightning detection is hampered. When the data processor 206 determines that the incoming data is saturated, the data processor 206 can send a signal to the antenna to either reduce or increase the amount of amplification applied to the incoming electromagnetic energy, resulting in a more accurate collection of data for the system 100.

Figure 4A:
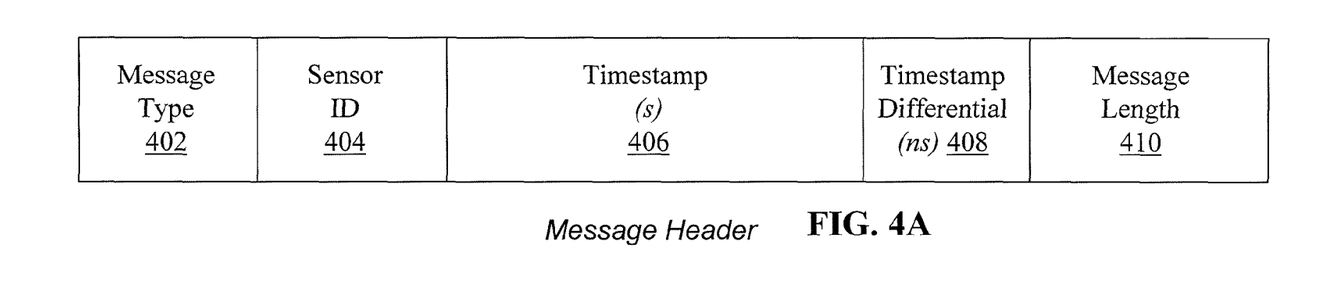
FIGS. 4A-4B are diagrams of a packet message format for transmitting the waveform data to the processing server.
Figure 4B:
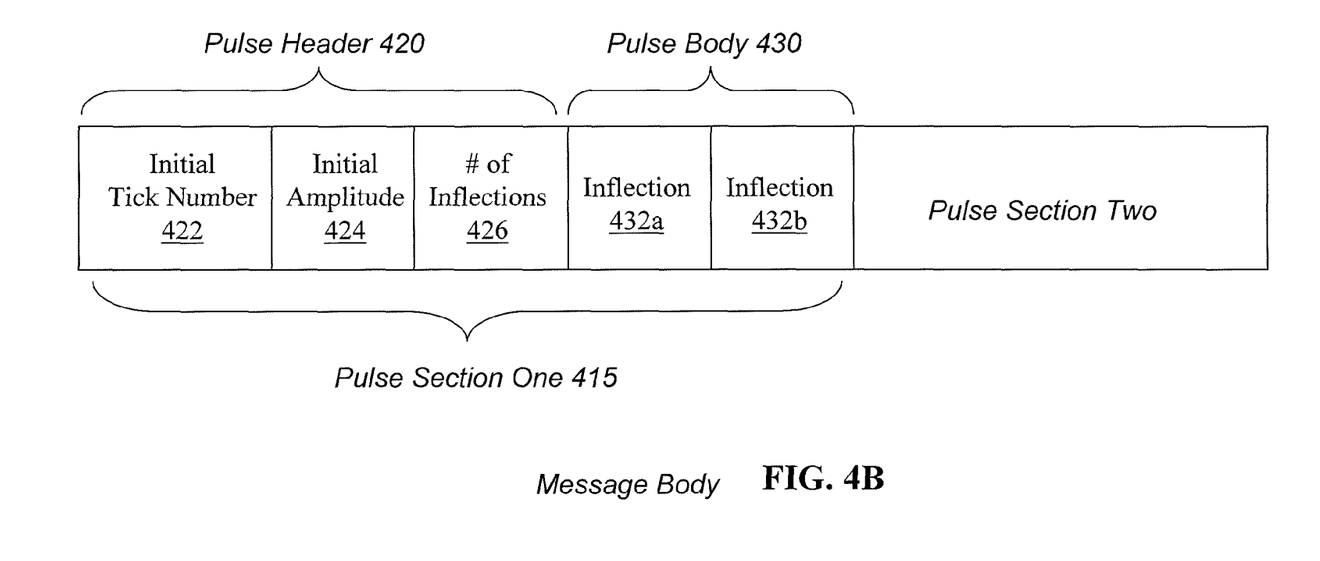

At the end of each second, the data processor 206 retrieves the filtered and compressed waveform data from the data storage 210 and transmits the data to the processing server 106 for further analysis. The data processor 206 also empties the data storage 210 in preparation for receiving a new set of waveform data. In transmitting the waveform data, the data processor 206 packetizes the data. FIGS. 4A-4B are diagrams of an example packet message format for transmitting the waveform data to the processing server 106. The messages sent by the waveform sensor 102a consist of a fixed length header, followed by a variable length message body. The last bytes of the header indicate the length of the body. The message type 402 consists of a two-byte indicator to notify the sensor 102a that the message is a request for certain data (e.g., 03='get data', 05='calibrate filter') or to notify the processing server 106 of success or failure of the request (e.g., 00=success, 01=failure).

FIG. 4A shows the format of the message header. The first two bytes of the header are the message type 402. The message type 402 consists of an indicator to notify the sensor 102a that the message is a request for certain data (e.g., 03='get data', 05='calibrate filter') or to notify the processing server 106 of success or failure of the request (e.g., 00=success, 01=failure). The next two bytes correspond to a unique identification number 404 for the waveform sensor 102a. The next four bytes are the time 406 in non-leap seconds since Jan. 1, 1970. The next byte is the number of nanoseconds 408 before or after this time. The last two bytes give the message length 410 (in number of bytes) after the header.

FIG. 4B shows the format of the message body. The message body consists of a plurality of pulse sections which contain the filtered, compressed waveform data collected by the sensor 102a. Each pulse section (e.g., pulse section one 415) comprises a pulse header 420 and a pulse body 430. The pulse header 420 is seven bytes long, and contains the initial tick number 422 (four bytes), the initial amplitude of the waveform 424 (two bytes), and the number of inflections 426 in the pulse body (one byte). Each inflection 432a-432b (one byte) expresses the difference between the amplitude of the next inflection and the amplitude of the current inflection. This message format allows the waveform sensor 102a to transmit details about the shape of the waveform without requiring the transmission of a large amount of data, which increases the overall processing speed and efficiency of the system 100.

In a preferred embodiment, each of the waveform sensors 102a-102d distributed throughout the system 100 transmits its individual filtered and compressed waveform data to the processing server 106 at the same time. This synchronization can be accomplished, for example, by referring to the time value of the timing GPS devices 214 at the respective waveform sensors 102a-102d. Since the timing GPS device 214 at each sensor 102a-102d are accurate within 100 nanoseconds, the sensors 102a-102d will transmit the processed waveform data to the processing server 106 at substantially the same time. The synchronization provides the benefit of reducing the processing time required for the processing server 106 to analyze the received waveform data.

The waveform sensors 102a-102d transmit the filtered and compressed waveform data to the processing server 106 via a communications network, e.g., communications network 104. The network 104 may be a wide area network, such as the Internet or the World Wide Web. The network 104 may utilize satellite communications technology. For example, the waveform sensors 102a-102d may send and receive information via a communications link to a satellite, which in turn communicates with the processing server 106.

In addition to transmitting the waveform data indicative of lightning activity, the waveform sensor 102a transmits weather conditions data collected by a weather conditions device 216 connected to the data processor 206. An example weather conditions device is the WeatherBug® Tracking Station manufactured by AWS Convergence Technologies, Inc. of Germantown, Md. The weather conditions device 216 is installed in close proximity to the waveform sensor 102a, and collects atmospheric conditions data such as temperature, barometric pressure, relative humidity, heat index, wind speeds, rainfall amounts, and other similar weather information. The weather conditions device 216 transmits the weather data to the data processor 206, which can include the weather data as part of its continuous data transmissions to the processing server 106.

Figure 5:
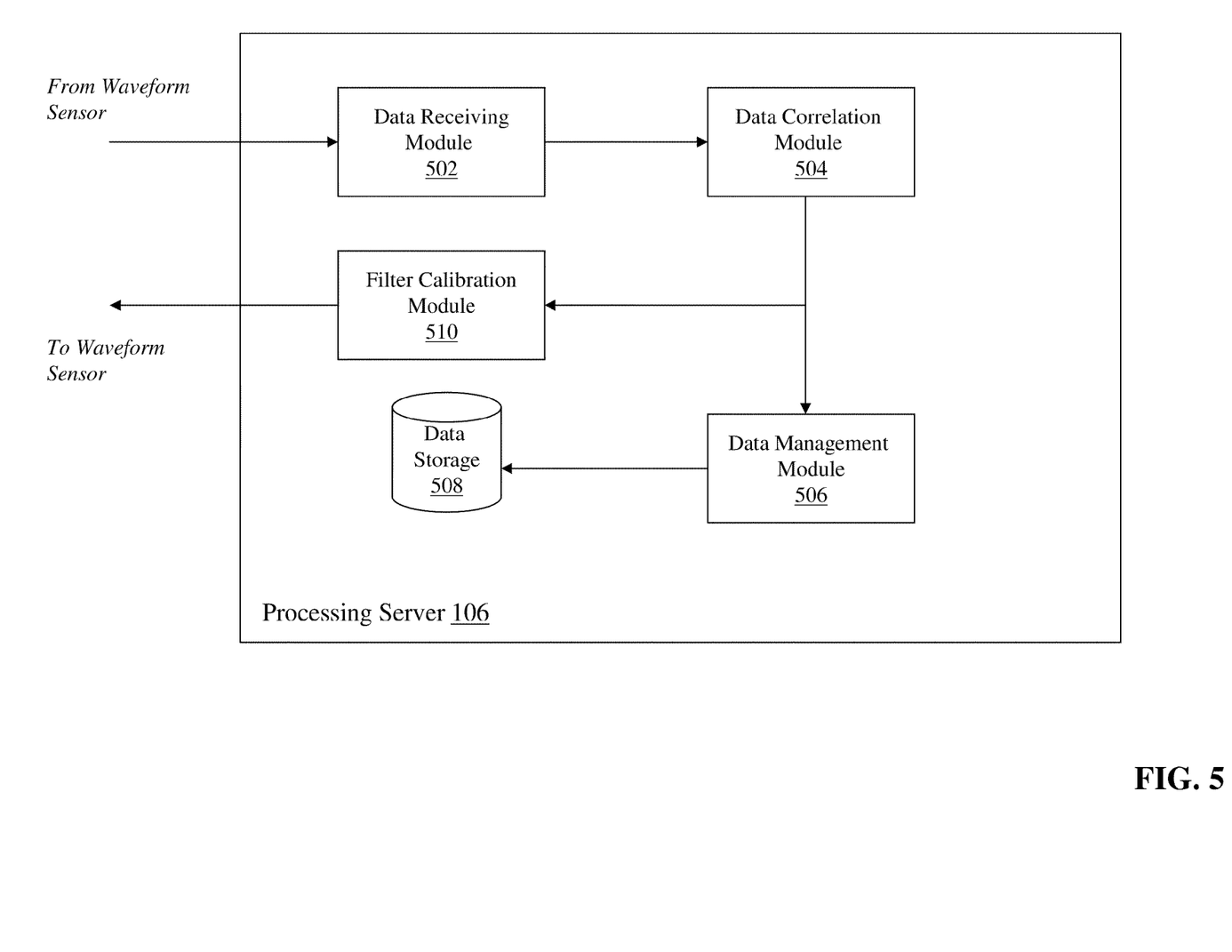
FIG. 5 is a detailed block diagram of a processing server for receiving and processing waveform data from a waveform sensor.

FIG. 5 is a detailed block diagram of a processing server 106 for receiving and processing waveform data from a waveform sensor 102a. The processing server 106 includes a data receiving module 502, a data correlation module 504, a data management module 506, a data storage module 508, and a filter calibration module 510. Any or all of the modules identified above can reside on the same physical server, or can be dispersed across multiple physical servers. Portions of each individual module can be divided among multiple servers to increase processing efficiency and balance the traffic received from the waveform sensors 102a-102d.

Figure 6:
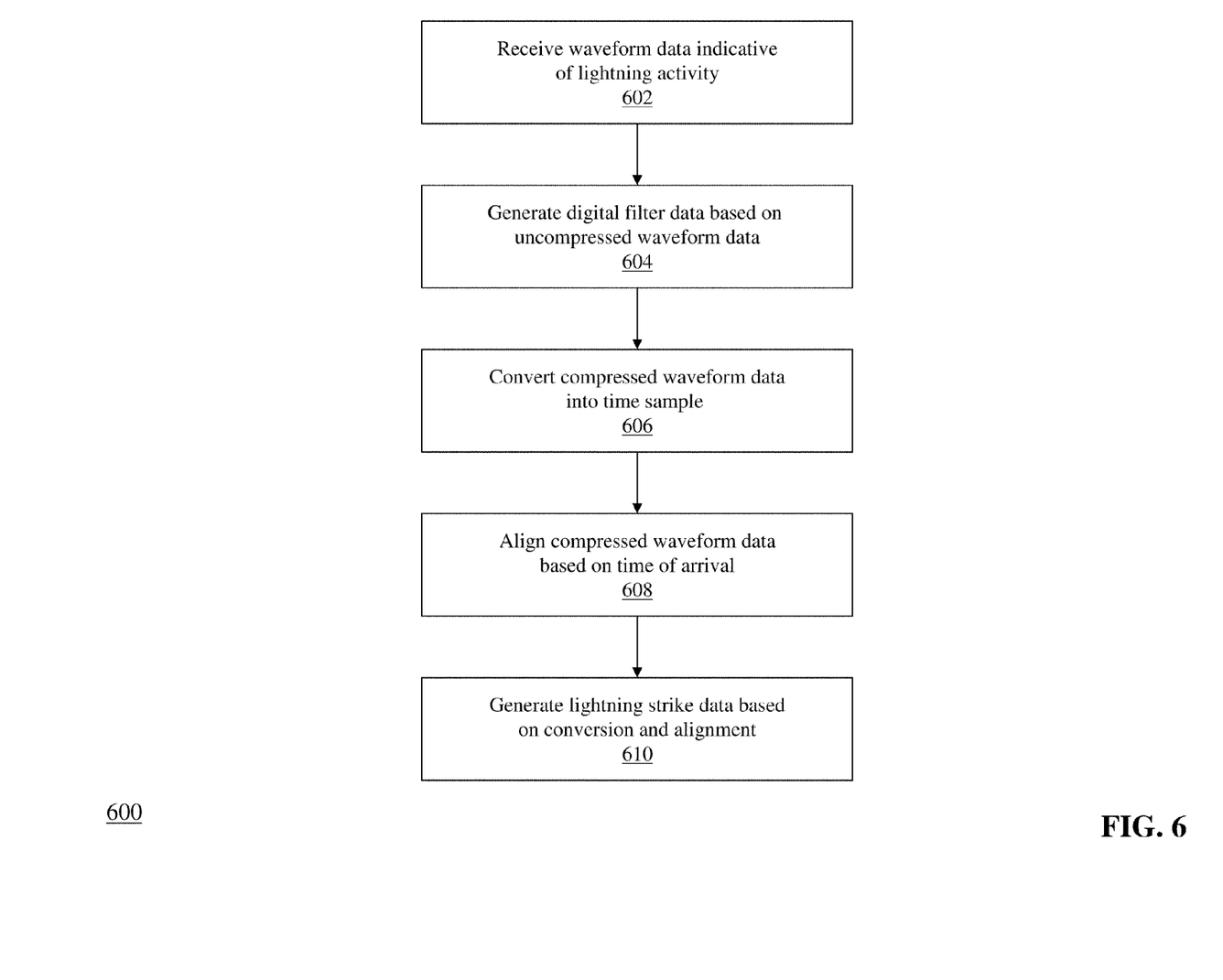
FIG. 6 is a flow diagram of an exemplary method for receiving and processing waveform data from a waveform sensor.

FIG. 6 is a flow diagram of an exemplary method 600 for receiving and processing waveform data from a waveform sensor 102a. The data receiving module 502 establishes a communications link with the waveform sensors 102a-102d via the communications network 104, and waits for waveform data to arrive. When the processing server 106 receives (602) waveform data indicative of lightning activity from the waveform sensors 102a-102d, the data receiving module 502 queues the data in a storage buffer (not shown). The data receiving module 502 analyzes the data in the message packets received from each sensor 102a-102d, and converts (606) the tick number into a time sample.

The data receiving module 502 transmits the waveform data received from the waveform sensors 102a-102d to the data correlation module 504. The data correlation module 502 reconstructs the waveform by starting with the initial amplitude of the waveform and analyzing each inflection associated with the waveform. For example, the data correlation module 504 receives waveform data indicating an initial amplitude of 289, a first inflection of 3 and a second inflection of 1, the data correlation module 504 can interpolate the data to represent that the amplitude of the waveform increased from 289 to 292 (289+3) between the first two marked points, and then increased from 292 to 293 (292+1) between the second and third marked points. The data correlation module 504 continues interpolating the waveform data until it has reconstructed the entire waveform.

Figure 7:
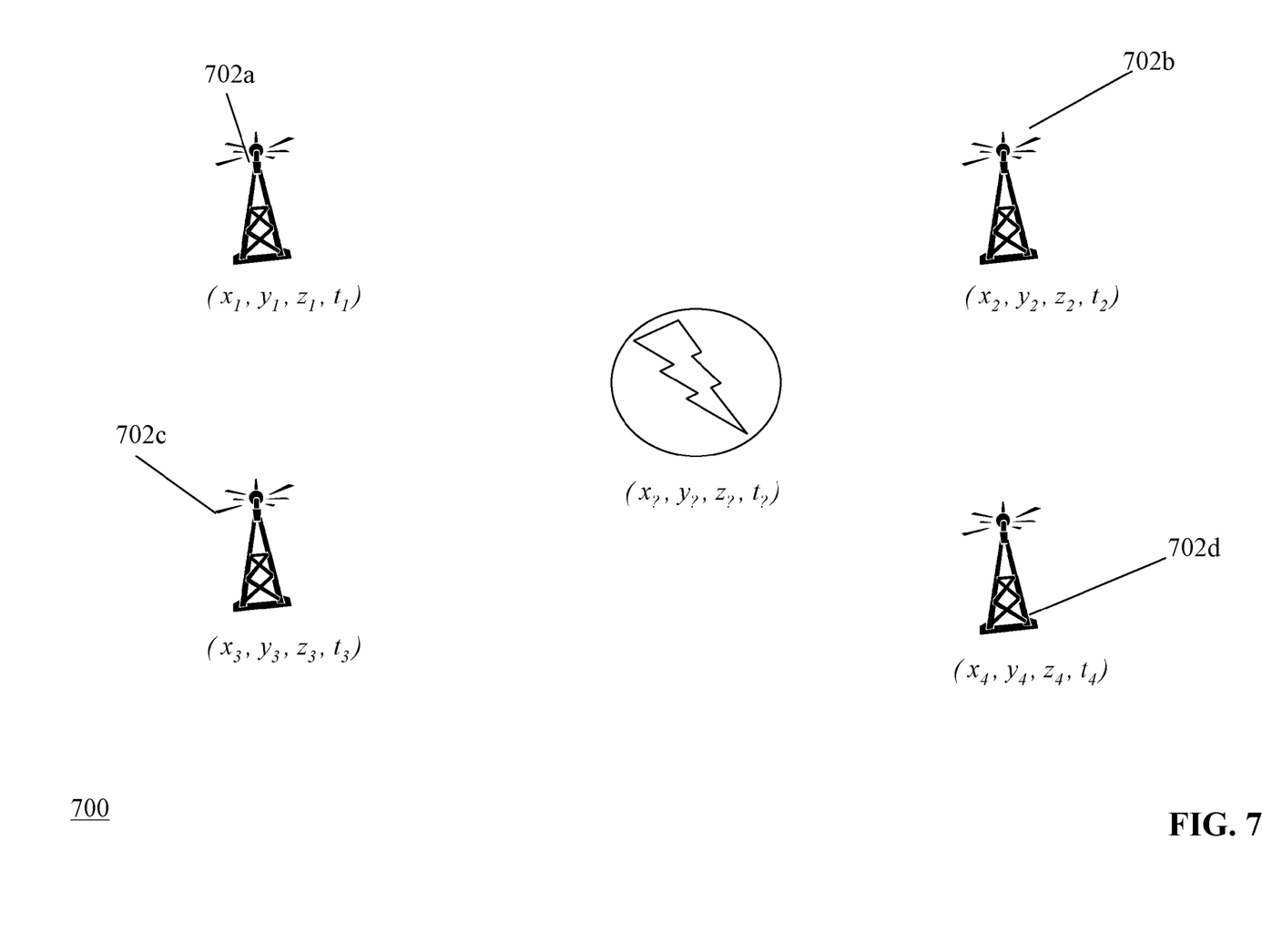
FIG. 7 is a diagram representing the cross-correlation of waveforms from different sensors to determine the location of a lightning strike.

After reconstructing the waveforms received from the plurality of waveform sensors 102a-102d, the data correlation module 504 aligns (608) the waveforms in order to determine if a lightning strike occurred. FIG. 7 is a diagram representing the cross-correlation (or alignment) of waveforms from different sensors 702a-702d to determine the location of a lightning strike. As indicated previously, each waveform detected by a sensor 702a-702d is associated with the geographic location (e.g., x, y) of that sensor, along with the time of arrival at the sensor 702a-702d. The data correlation module 504 can determine that a waveform received from each of four different sensors 702a-702d should be grouped together based an evaluation of the relative locations of the sensors 702a-702d and the similarity of the respective times of arrival. Once the data correlation module 504 has grouped the waveforms, the data correlation module 504 processes an algorithm incorporating the parameters (x, y, z, t) for each sensor 702a-702d along with the 'unknown' parameters for the location of the lightning strike, where x and y are the geographic coordinates of the sensor 702a-702d, z is the altitude of the waveform, and t is the time of arrival. In a preferred embodiment, four waveforms from four different sensors are grouped. Waveforms from additional sensors can also be evaluated in the same group for further optimization of the calculations to determine the lightning strike location. In addition, the data correlation module 504 can calculate the peak current of the lightning activity based on an analysis of the amplitude data associated with the waveforms from each of the four sensors 702a-702d. The data correlation module 504 generates (610) lightning strike data based on the conversion and alignment of the waveform data.

The data correlation module 504 can determine a confidence level associated with the generated lightning strike data. The confidence level is based on the degree of accuracy which the data correlation module 504 assigns to a particular determination of the location of a lightning strike. In order to determine a confidence level, the data correlation module 504 can consider numerous factors, including but not limited to the consistency of the respective waveform data among the grouped waveforms, the integrity of the data received from the various waveform sensors 102a-102d (e.g., no missing, corrupt or unusable data), the level and variability of the background noise in a particular area, and the relative precision of the instrumentation associated with the waveform sensors 102a-102d. In some examples, the data correlation module 504 can also consider historic lightning data associated with one or more of the waveform sensors 102a-102d as a baseline for evaluating the uniformity and consistency of the present data received from those sensors 102a-102d. The algorithm used to calculate the confidence level can be weighted according to a proprietary structure, and the variables considered in determining the confidence level can receive more or less emphasis in the algorithm based on certain preferences. The data correlation module 504 can associate the confidence level with lightning strike data when the data is stored in the storage device 508, and the confidence level can be provided as a component of the overall lightning activity data.

After the data correlation module 504 has determined the location of the lightning activity based on the waveform data, the lightning strike data is transmitted to the data management module 506. The data management module 506 stores the lightning strike data in the data storage module 508, and also caches the data for retrieval and use by various third-party applications. In one example, the data management module 506 can stream real-time lightning activity data to subscribers connected to the processing server via a data transfer connection, such as a TCP/IP connection. In another example, the data management module 506 can provide the lightning strike data to proprietary applications which generate maps and other graphical representations of the lightning strike data for display on remote devices, such as personal computers, smart phones, personal digital assistants, and the like. In another example, lightning alerts and other warnings can be issued in real time to various media and news outlets as soon as threatening lightning activity is detected.

The data management module 506 also calculates lightning rates based on the lightning strike data. The data management module 506 can determine, for example, lightning strike rate and the rate of change with respect to the lightning rate. The module 506 can determine the strike rate and rate of change for intracloud and cloud-to-ground lightning individually, and for the total lightning rate, i.e., intracloud and cloud-to-ground lightning.

Updating the Digital Filter

Figure 8:
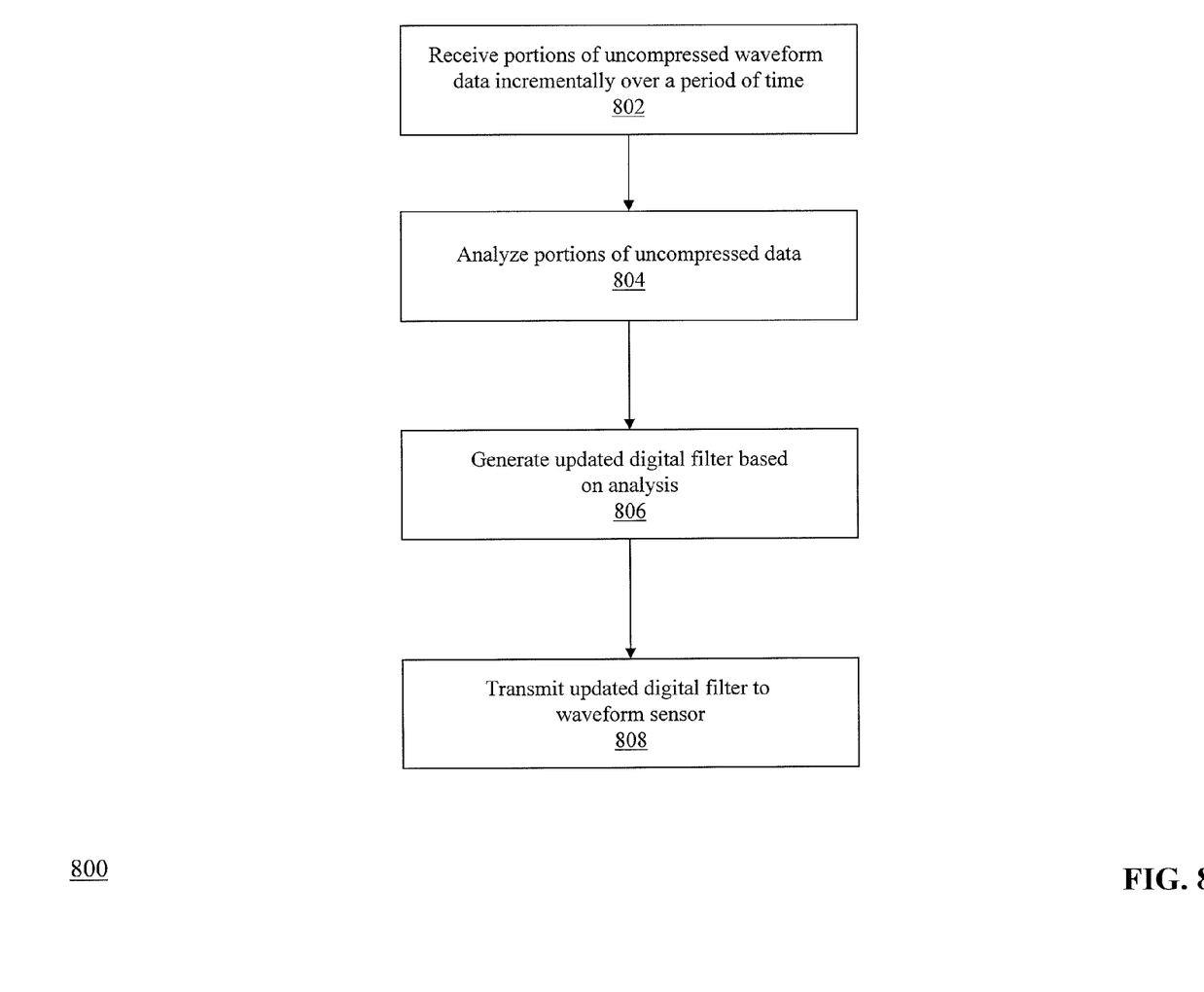
FIG. 8 is a flow diagram of an exemplary method for updating the digital filter module based on uncompressed waveform data.

An important technique of the claimed invention is the precision with which the waveform sensor 102a filters the electromagnetic waveforms to isolate only the frequencies corresponding to lightning activity. In order to maintain accurate data collection and filtering, the sensor 102a frequently updates the background noise thresholds of the digital filter module 208a based on the waveform samples collected by the antenna 202. Generally, the compressed waveform data transmitted by the sensors 102a-102d does not provide enough detailed information for the processing server 106 to determine the relative levels of noise frequency within the waveform and generate an accurate digital filter to remove the noise. Therefore, the processing server 106 must receive uncompressed waveform data in order to properly assess the background noise and create a digital filter capable of removing the necessary frequencies. However, transmittal of uncompressed waveform data requires significant processing time and bandwidth, and may impact the desired speed and efficiency of the system 100 in detecting lightning activity. FIG. 8 is a flow diagram of an exemplary method 800 for updating the digital filter module 208a based on uncompressed waveform data. As part of its receipt of compressed waveform data according to the methods and techniques presented above, the data processor 206 receives (802) portions of uncompressed waveform data from an individual waveform sensor 102a. However, instead of transmitting an entire uncompressed waveform, the waveform sensor 102a transmits small portions of the uncompressed waveform to the processing server 106 at regular intervals (e.g., every two hours) throughout the day. At the end of the day, the filter calibration module 510 at the processing server 106 consolidates the small portions of uncompressed data into a larger data set that contains sufficient detail, and the filter calibration module 510 analyzes (804) the data set to determine background noise levels and generate (806) an appropriate digital filter. The filter calibration module 510 transmits (808) the newly-generated digital filter data back to the individual waveform sensor 102a, and the sensor 102a updates its digital filter module 208a.

The above-described systems and methods can be implemented in digital electronic circuitry, in computer hardware, firmware, and/or software. The implementation can be as a computer program product (i.e., a computer program tangibly embodied in a computer readable storage medium). The implementation can, for example, be in a machine-readable storage device and/or include a propagated signal, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the invention by operating on input data and generating output. Method steps can also be performed by and an apparatus can be implemented as special purpose logic circuitry. The circuitry can, for example, be a FPGA (field programmable gate array), an ASIC (application-specific integrated circuit), a DSP (digital signal processor), and/or any other discrete circuitry that is configured to implement the required functions. Modules, subroutines, and software agents can refer to portions of the computer program, the processor, the special circuitry, software, and/or hardware that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer can include, can be operatively coupled to receive data from and/or transfer data to one or more mass storage devices for storing data (e.g., magnetic, magneto-optical disks, or optical disks).

Data transmission and instructions can also occur over a communications network. Computer readable mediums suitable for embodying computer program instructions and data include all forms of non-volatile memory, including by way of example semiconductor memory devices. The computer readable mediums can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a user, the above described techniques can be implemented on a computer having a display device or a transmitting device. The display device can be, for example, a cathode ray tube (CRT) and/or a liquid crystal display (LCD) monitor. The interaction with a user can be, for example, a display of information to the user and a keyboard and a pointing device (e.g., a mouse or a trackball) by which the user can provide input to the computer (e.g., interact with a user interface element). Other kinds of devices can be used to provide for interaction with a user. Other devices can be, for example, feedback provided to the user in any form of sensory feedback (e.g., visual feedback, auditory feedback, or tactile feedback). Input from the user can be, for example, received in any form, including acoustic, speech, and/or tactile input.

The client device and the computing device can include, for example, a computer, a computer with a browser device, a telephone, an IP phone, a mobile device (e.g., cellular phone, personal digital assistant (PDA) device, smart phone, laptop computer, electronic mail device), and/or other communication devices. The browser device includes, for example, a computer (e.g., desktop computer, laptop computer) with a world wide web browser (e.g., Microsoft® Internet Explorer® available from Microsoft Corporation, Mozilla® Firefox available from Mozilla Corporation). The mobile computing device includes, for example, a Blackberry®.

The web servers can be, for example, a computer with a server module (e.g., Microsoft® Internet Information Services available from Microsoft Corporation, Apache Web Server available from Apache Software Foundation, Apache Tomcat Web Server available from Apache Software Foundation).

The above described techniques can be implemented in a distributed computing system that includes a back-end component. The back-end component can, for example, be a data server, a middleware component, and/or an application server. The above described techniques can be implemented in a distributing computing system that includes a front-end component. The front-end component can, for example, be a client computer having a graphical user interface, a Web browser through which a user can interact with an example implementation, and/or other graphical user interfaces for a transmitting device. The components of the system can be interconnected by any form or medium of digital data communication (e.g., a communication network).

The system can include clients and servers. A client and a server are generally remote from each other and typically interact through a communication network. The relationship of client and server arises by virtue of computer programs running on the respective computers and having a client-server relationship to each other.

The above described communication networks can be implemented in a packet-based network, a circuit-based network, and/or a combination of a packet-based network and a circuit-based network. Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, bluetooth, code-division multiple access (CDMA) network, time division multiple access (TDMA) network, global system for mobile communications (GSM) network), and/or other circuit-based networks.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein.

What is claimed is:

1. A method for detecting lightning activity, the method comprising:
receiving, at a waveform sensor, waveform data indicative of the lightning activity from one or more signal converters, the waveform data comprising a group of electromagnetic waveforms;
filtering, at a processor disposed within the waveform sensor, the waveform data to remove noise frequencies, the filtering comprising:
transmitting one or more uncompressed portions of the waveform data to a server computing device;
receiving digital filter data from the server computing device, the digital filter data based on the one or more uncompressed portions of waveform data;
removing, by the processor, one or more frequencies from the waveform data based on the digital filter data;
compressing, at the processor, the waveform data, the compressing comprising:
(i) selecting one or more points on a waveform, the one or more points being above a predetermined threshold; and
(ii) determining an inflection of the selected points based on a predefined algorithm;
transmitting, by the waveform sensor, the compressed waveform data to a processing server for analysis to detect lightning activity.

2. The method of claim 1, wherein the compressing occurs substantially simultaneously with filtering of the waveform data.

3. The method of claim 1, further comprising collecting the waveform data by a radio frequency antenna connected to the waveform sensor via the one or more signal converters.

4. The method of claim 1, wherein the selecting step further comprises selecting about one thousand points on each waveform.

5. The method of claim 1, further comprising storing the compressed waveform data in a temporary storage device.

6. The method of claim 1, further comprising:
receiving, at the waveform sensor, weather conditions data from a weather device; and
transmitting the weather conditions data to the server computing device.

7. The method of claim 1, further comprising transmitting the compressed waveform data to the server computing device.

8. The method of claim 7, wherein the compressed waveform data is transmitted to the server computing device every second.

9. The method of claim 7, further comprising coordinating the transmission of the compressed waveform data with a timing global positioning device connected to the waveform sensor.

10. The method of claim 1, wherein the one or more converters comprise a high-frequency converter and a low-frequency converter.

11. The method of claim 10, wherein the high-frequency converter is capable of processing frequencies between 5 kHz and 12 MHz.

12. The method of claim 10, wherein the low-frequency converter is capable of processing frequencies greater than 1 Hz and less than or equal to 250 kHZ.

13. A method for detecting lightning activity, the method comprising:
receiving, at a processing server, waveform data indicative of the lightning activity from one or more waveform sensors;
generating, at the processing server, digital filter data based on one or more uncompressed portions of waveform data from a predetermined sensor and transmitting the digital filter data to the predetermined sensor;
converting, at the processing server, the compressed waveform data from each of the one or more sensors into a time sample;
aligning, at the processing server, the compressed waveform data from the one or more sensors based on a time of arrival of the compressed waveform data, the aligning comprising:
(i) determining a location and height of a waveform based on the compressed waveform data;
(ii) determining an offset of the waveform based on the time sample associated with the compressed waveform data;
(iii) determining a peak current of the waveform based on the compressed waveform data; and
generating lightning strike data based on the conversion and alignment of the compressed waveform data.

14. The method of claim 13, further comprising generating a confidence level based on the location of the one or more sensors and assigning the confidence level to the lightning strike data.

15. The method of claim 13, further comprising generating an alert associated with the lightning strike data and transmitting the alert to a remote device.

16. The method of claim 13, further comprising storing the lightning strike data in a storage device.

17. The method of claim 13, further comprising transmitting the lightning strike data to a remote device.

18. The method of claim 13, further comprising providing the lightning strike data to a requesting device.

19. The method of claim 13, wherein the server receives the waveform data from each of the one or more sensors at the same time.

20. The method of claim 13, wherein the aligning the waveform data includes data received from at least four sensors.

21. The method of claim 13, further comprising generating a graphical representation of the lightning strike data.

22. The method of claim 21, wherein the graphical representation comprises a geographical map corresponding to the coverage area of the sensors.

23. The method of claim 13, the generating lightning strike data further comprising determining a type of lightning strike based on the waveform frequency.

24. The method of claim 23, wherein the type of lightning strike includes intracloud lightning and cloud-to-ground lightning.

25. A system for detecting lightning activity, the system comprising:
one or more waveform sensors, the waveform sensors configured to receive waveform data from one or more signal converters, the waveform data comprising a group of electromagnetic waveforms, the sensor comprising a processor that filters the waveform data to remove noise frequencies, and compresses the waveform data, the compressing comprising:
(i) selecting one or more points on a waveform, the one or more points being above a predetermined threshold; and (ii) determining an inflection of the selected points based on a predefined algorithm; and a server configured to:

receive waveform data from the one or more waveform sensors, the waveform data comprising compressed and uncompressed waveform data;

generate digital filter data based on one or more uncompressed portions of waveform data from a particular sensor and transmitting the digital filter data to the selected sensor;

convert the compressed waveform data from each of the one or more sensors into a time sample;

align the compressed waveform data from the one or more sensors based on a time of arrival of the compressed waveform data, the aligning comprising:

determining a location and height of a waveform based on the compressed waveform data from the one or more sensors;

determining an offset of the waveform based on the time sample associated with the compressed waveform data;

determining a peak current of the waveform based on the compressed waveform data; and generate lightning strike data based on the conversion and alignment of the compressed waveform data.

26. The system of claim 25, the one or more sensors further configured to transmit one or more uncompressed portions of the waveform data to the server;

receive digital filter data from a server, the digital filter data based on the one or more uncompressed portions of waveform data; and remove one or more frequencies from the waveform data based on the digital filter data.

27. A system for detecting lightning activity comprising:

means for receiving waveform data from one or more signal converters, the waveform data comprising a group of electromagnetic waveforms;

means for filtering the waveform data to remove noise frequencies;

means for compressing the waveform data, the compressing comprising:

selecting one or more points on a waveform, the one or more points being above a predetermined threshold; and determining an inflection of the selected points based on a predefined algorithm;

means for receiving waveform data from the one or more waveform sensors, the waveform data comprising compressed and uncompressed waveform data;

means for generating digital filter data based on the uncompressed portions of waveform data from a particular sensor and transmitting the digital filter data to the selected sensor;

means for converting the compressed waveform data from each of the one or more sensors into a time sample;

means for aligning the compressed waveform data from the one or more sensors based on a time of arrival of the compressed waveform data, the aligning comprising:

determining a location and height of a waveform based on the compressed waveform data from the one or more sensors;

determining an offset of the waveform based on the time sample associated with the compressed waveform data;

determining a peak current of the waveform based on the compressed waveform data; and means for generating lightning strike data based on the conversion and alignment of the compressed waveform data.

* * * * *